(12) United States Patent
Kim et al.

(10) Patent No.: US 7,732,054 B2
(45) Date of Patent: Jun. 8, 2010

(54) METHOD FOR PREPARING ZNO NANOCRYSTALS DIRECTLY ON SILICON SUBSTRATE

(75) Inventors: Young Hwan Kim, Seoul (KR); Woon Jo Cho, Gyeonggi-do (KR); Seong Kim, II, Seoul (KR); Chun Keun Kim, Seoul (KR); Yong Tae Kim, Gyeonggi-do (KR)

(73) Assignee: Korea Institute of Science and Technology, Seoul (KR)

( * ) Notice: Subject to any disclaimer, the term of this patent is extended or adjusted under 35 U.S.C. 154(b) by 81 days.

(21) Appl. No.: 11/966,552

(22) Filed: Dec. 28, 2007

(65) Prior Publication Data

US 2008/0160292 A1    Jul. 3, 2008

(30) Foreign Application Priority Data

Jan. 2, 2007    (KR)    ............. 10-2007-0000143

(51) Int. Cl.
 *B32B 9/04*     (2006.01)
 *B32B 13/04*    (2006.01)
 *B32B 9/00*     (2006.01)
 *H01L 29/10*    (2006.01)

(52) U.S. Cl. ............... 428/446; 257/43; 428/448; 428/702; 977/774

(58) Field of Classification Search ............. 257/43; 428/446, 448, 702; 977/774
See application file for complete search history.

(56) References Cited

U.S. PATENT DOCUMENTS

2008/0128931 A1*    6/2008    Hsieh et al. ............. 264/21

FOREIGN PATENT DOCUMENTS

| JP | 2001205094 | 7/2001 |
| JP | 2003105533 | 4/2003 |
| JP | 2004137135 | 5/2004 |
| JP | 2006256956 | 9/2006 |
| JP | 20060112056 | 10/2006 |

OTHER PUBLICATIONS

Kumar et al., "Growth of ZnO nanocrystals in Silica by RF Co-Sputter Deposition and Post Annealing", Nuclear Instruments and Methods in Physics Research B, vol. 244, (2006) pp. 91-94.*
Peng et al., "White Light Emitting ZnO-SiO2 Nanocomposite Thin Films Prepared by the Target Attached Sputtering Method", Nanotechnology, vol. 17, (2006), pp. 174-180.*
Leong et al., "Sol-Gel ZnO-SiO2 Composite Waveguide Ultraviolet Lasers", IEEE Photonics Technology Letters, vol. 16, No. 11, (2004), pp. 2418-2420.*

* cited by examiner

*Primary Examiner*—Timothy M Speer
*Assistant Examiner*—Jonathan C Langman
(74) *Attorney, Agent, or Firm*—Browdy & Neimark, PLLC

(57) ABSTRACT

A method for preparing a ZnO nanocrystal directly on a silicon substrate includes the steps of: (S1) forming a Zn—Si—O composite thin film on the silicon substrate; and (S2) thermally treating the obtained thin film. Particularly, ZnO nanocrystals are formed in an amorphous Zn—Si—O composite thin film by controlling the composition of the Zn—Si—O composite thin film and heating temperature thereof. With the present invention method for preparing a ZnO nanocrystal directly on a silicon substrate, more possibilities are opened up for the applications of ZnO nanocrystals to an optoelectronic device in use of a silicon substrate.

6 Claims, 2 Drawing Sheets

METHOD FOR PREPARING ZNO NANOCRYSTALS DIRECTLY ON SILICON SUBSTRATE

CROSS-REFERENCE(S) TO RELATED APPLICATIONS

The present invention claims priority of Korean patent application No. 10-2007-0000143, filed on Jan. 2, 2007, which is incorporated by reference in its entirety.

BACKGROUND OF THE INVENTION

The present invention relates to a method for preparing a ZnO nanocrystal directly on a silicon substrate, more specifically, to a method for preparing a ZnO nanocrystal directly on a silicon substrate, including the steps of: forming a Zn—Si—O composite thin film on the silicon substrate (S1); and performing a heat treatment on the obtained film (S2).

In general, nanosize (nm, $10^{-9}$ m) materials differ from the same materials but in macrosize by physical and chemical properties. Because of a large surface area-mass ratio, nanosize materials can be applied to a photocatalyst using chemical reactions that occur at the surface and an optoelectronic device using optical properties due to surface defects.

Moreover, ZnO can stably emit UV light by exciton due to its broad direct energy bandgap of 3.36 eV and large exciton binding energy of 60 meV at room temperature. These excellent optical properties have caused a lot of interest in ZnO for optoelectronic applications such as ultraviolet LED or LD.

Among many structural configurations (single crystal, thin film, low-dimensional nanostructure, etc.), researches have recently been actively undertaken on a fabrication method of ZnO of low-dimensional nanostructure in relation to nano-optoelectronic devices. ZnO nanocrystals, one of low-dimensional nanostructure configurations, are fabricated primarily by chemical approaches (A. V. Dijken at al, J of Luminescence 90, 123-128 (2000); R. Viswanatha et al, J of Materials Chemistry 14, 661-668 (2004); K. Lin et al, Appl. Phys. Lett. 88, 263117-1~3 (2006)). However, ZnO nanocrystals prepared by chemical approaches exist in solution-phase, so an additional process, i.e., coating the nanocrystals over a silicon substrate is required to produce an optoelectronic device based on the silicon substrate.

SUMMARY OF THE INVENTION

It is, therefore, an object of the present invention to provide a method for preparing a ZnO nanocrystal in an amorphous Zn—Si—O composite thin film directly on a silicon substrate, so that an optoelectronic device based on a silicon substrate may be produced without requiring an additional coating process.

In accordance with the present invention, there is provided a method for preparing a ZnO nanocrystal directly on a silicon substrate, including the steps of: forming a Zn—Si—O composite thin film on the silicon substrate (S1); and performing a heat treatment on the obtained film (S2).

In the exemplary method for preparing a ZnO nanocrystal directly on the silicon substrate, ZnO nanocrystals may be formed in an amorphous Zn—Si—O composite thin film on the silicon substrate.

In the exemplary method for preparing a ZnO nanocrystal directly on the silicon substrate, the step S1 is carried out by sputtering. Further, a Zn/Si ratio in the Zn—Si—O composite thin film may be determined by adjusting an area ratio of silicon to a ZnO target. The Zn/Si ratio may range from 1.0 to 2.0. Further, the step S1 may be carried out under oxidation atmosphere containing a gas mixture of argon and oxygen, in which the argon gas and the oxygen gas are mixed at a ratio of 1:1. Optionally, the silicon substrate may not be heated in the step S1.

In the exemplary method for preparing a ZnO nanocrystal directly on the silicon substrate, the step S2 may be carried out at a temperature range from 700 to 750° C. by rapid thermal annealing under inert atmosphere (such as nitrogen or argon).

Another aspect of the present invention provides an optoelectronic device, including: a silicon substrate; a Zn—Si—O composite thin film formed on the silicon substrate; and a ZnO nanocrystal formed in the composite thin film.

In short, the present invention method for preparing a ZnO nanocrystal makes it possible to form ZnO nanocrystals directly on a silicon substrate, so great possibilities are opened up for the applications of ZnO nanocrystals to an optoelectronic device in use of a silicon substrate.

The other objectives and advantages of the invention will be understood by the following description and will also be appreciated by the embodiments of the invention more clearly. Further, the objectives and advantages of the invention will readily be seen that they can be realized by the means and its combination specified in the claims.

DESCRIPTION OF SPECIFIC EMBODIMENTS

Hereinafter, preferred examples of the present invention will be set forth in detail so that those skilled in the art can easily carry out the invention.

The present invention relates to a method for preparing a ZnO nanocrystal in an amorphous Zn—Si—O composite thin film directly on a silicon substrate, to thus facilitate the manufacture of an optoelectronic device in use of ZnO nanocrystals.

A first step thereof is forming a Zn—Si—O composite thin film on a silicon substrate. This is accomplished by sputtering, and silicon and ZnO are used at the same time as a target. Especially, by varying the number of ZnO targets placed on a silicon target, that is, by adjusting the (surface) area ratio of silicon and ZnO targets to be sputtered, it becomes easy to fabricate Zn—Si—O thin films of diverse compositions. In an exemplary embodiment of the present invention, a Zn—Si—O thin film was prepared by disposing a 1 cm-diameter ZnO target on a 2 in-diameter silicon target.

A mixture of argon and oxygen was used as a sputtering gas. The reason for using oxygen as part of the sputtering gas is to obtain Zn—Si—O oxide films, while using a silicon single crystal as a target for a reactive sputtering process. Preferably, argon and oxygen are mixed at a ratio of 1:1 to prevent a substantial drop in the deposition rate of thin films that occurs when oxygen content in the mixture exceeds 50%.

Moreover, instead of heating a substrate to deposit a thin film on the silicon substrate, temperature of the substrate may increase spontaneously during the film deposition process as particles, which are produced by the sputtering process, collide with the substrate. The obtained Zn—Si—O composite thin film exists in an amorphous form with Zn and Si particles evenly distributed over the entire film.

A second step involves a heat treatment of the Zn—Si—O composite thin film to prepare ZnO nanocrystals. The heat treatment is carried out by rapid thermal annealing (RTA).

A vital part of the present invention method for preparing a ZnO nanocrystal in an amorphous Zn—Si—O composite thin film directly on a silicon substrate is how to set conditions for Zn/Si composition in the Zn—Si—O composite thin film and heating temperature of the thin film. In other words, the Zn/Si ratio in a Zn—Si—O composite thin film is very important for preparation of ZnO nanocrystals.

For example, the Zn/Si ratio in a Zn—Si—O composite thin film may range from 1.0 to 2.0, preferably 1.5 to 1.6. If the Zn/Si ratio is greater than 2.0, a ZnO thin film with a lot of defects may be formed after heat treatment. Meanwhile, if the Zn/Si ratio is less than 1.0, light emission properties of a resulting thin film may be seriously deteriorated.

Figure 2:
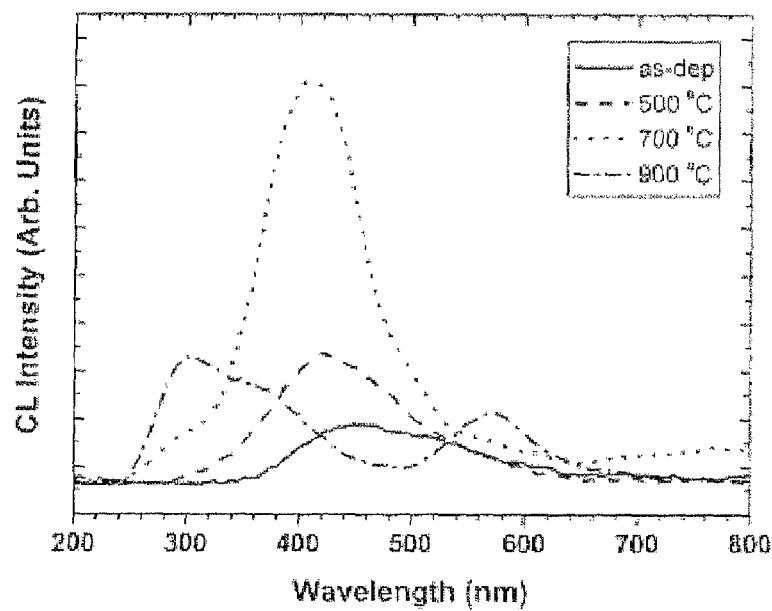
FIG. 2 shows the cathodoluminescence spectrum of a Zn—Si—O thin film with a Zn/Si ratio of 1.56 at different heat treatment temperatures.

A preferable heating temperature of the thin film ranges from 650 to 750° C. If the heating temperature is either higher or lower than this range, light emission properties of an optoelectronic device obtained are considerably deteriorated or damaged as shown in FIG. 2. Also, the heat treatment may be performed by rapid thermal annealing at a heating rate of 70° C./sec or higher. Since the thin film is rapidly heated to a desired temperature within a very short amount of time, an interface reaction between the thin film and the substrate may be minimized during heat treatment of the thin film. Further, the heat treatment can be done under inert atmosphere using an inert gas such as nitrogen or argon. In so doing, the thin film is less likely to be oxidized, and a concentration of defects such as oxygen vacancy related to conductivity of the thin film can be maintained. When the thin film is completely oxidized, it becomes an insulator.

The examples are described below in order to explain the present invention in further detail. Also, it should be noted that the following examples are described for illustrative but not limitative purposes.

Example 1

Optimum Zn/Si Ratio in Zn—Si—O Composite Thin Film

Figure 1:
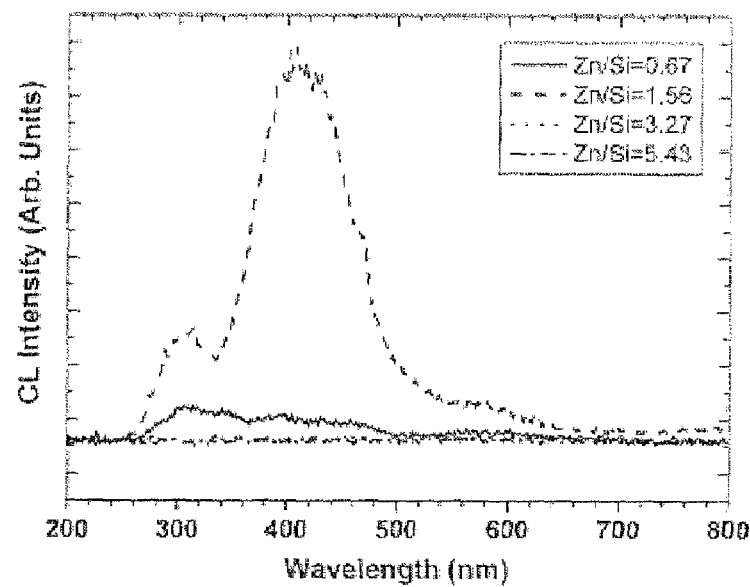
FIG. 1 shows the cathodoluminescence spectrum of a Zn—Si—O composite thin film at different compositions of Zn/Si.

Varying the number of a 1 cm-diameter ZnO target placed on a 2 in-diameter silicon target, Zn—Si—O thin films with diverse Zn/Si ratios ranging from 0.67 to 5.43 were prepared by sputtering. Each one of the Zn—Si—O thin films with diverse Zn/Si ratios was thermally treated at 700° C. for 3 minutes under nitrogen atmosphere. When cathodoluminescence properties of the thermally treated films were examined, as shown in FIG. 1, a thin film with the Zn/Si ratio of 1.56 had a strong emission peak in a UV-blue region (375-450 nm). This implies that there is an optimum Zn/Si ratio for preparing ZnO nanocrystals directly on a silicon substrate.

Example 2

Heat Treatment Conditions

The Zn—Si—O thin film with the Zn/Si ratio of 1.56 was then heated by rapid thermal annealing at various temperatures between 500° C. and 900° C. for three minutes under nitrogen atmosphere. As shown in FIG. 2, the heat treatment at 700° C. provided the thin film with excellent light emission properties in the UV-blue region (370-450 nm).

Example 3

ZnO Nanocrystal Formation Observed by TEM Analysis

Figure 3:
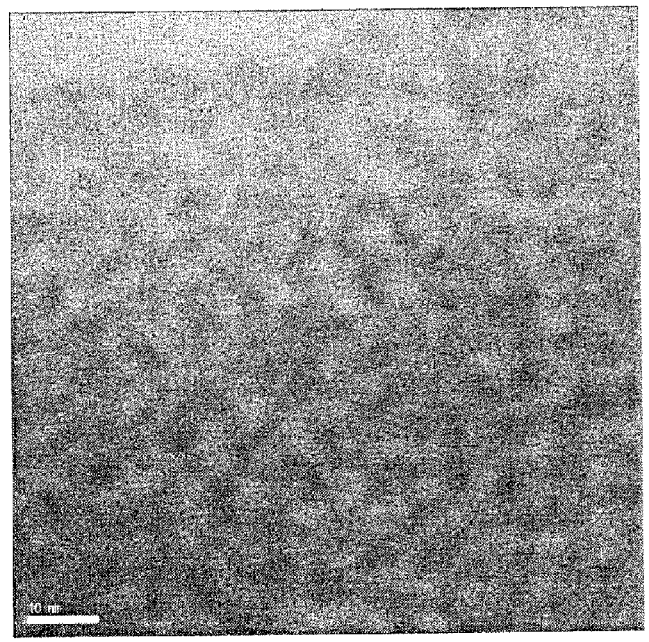
FIG. 3 depicts a TEM image of a Zn—Si—O thin film with a Zn/Si ratio of 1.56, which has been thermally treated at 700° C. for 3 minutes.
Figure 4:
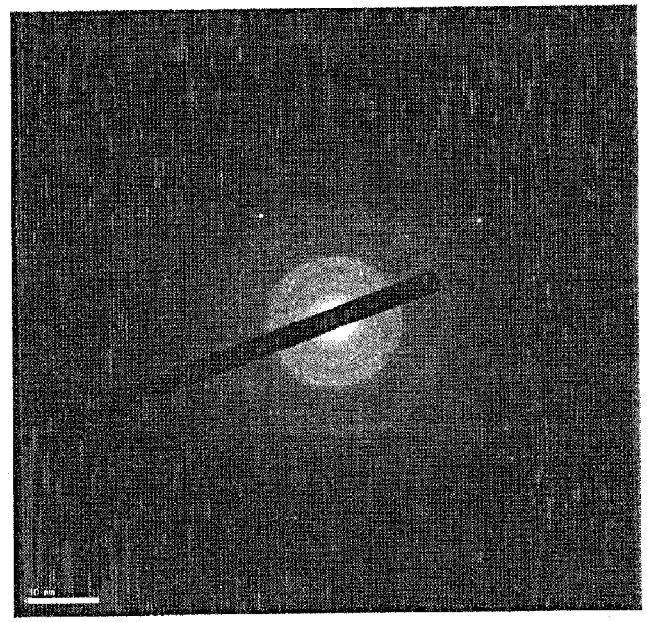
FIG. 4 depicts an electron diffraction pattern obtained from the image of FIG. 3.

The Zn—Si—O thin film with the Zn/Si ratio of 1.56 having been subjected to rapid thermal annealing at 700° C. for three minutes according to Examples 1 and 2 was observed through TEM (Transmission Electron Microscope). As depicted in the image of FIG. 3, nanocrystals with an average particle size of about 5 cm are evenly distributed over an amorphous Zn—Si—O composite thin film. FIG. 4 illustrates an electron diffraction pattern obtained from a sample of the image in FIG. 3. In result of an analysis on the electron diffraction pattern, it was confirmed that nanocrystals observed in FIG. 3 contain ZnO nanocrystals.

In conclusion, the light emission properties and the TEM image analysis result indicate that when the Zn—Si—O thin film with the Zn/Si ratio of 1.56 is treated with rapid thermal annealing at 700° C. for three minutes, it becomes possible to form ZnO nanocrystals in the amorphous Zn—Si—O composite thin film directly on the silicon substrate.

While the present invention has been described with respect to the specific examples, it will be apparent to those skilled in the art that various changes and modifications may be made without departing from the spirit and scope of the invention as defined in the following claims.

What is claimed is:

1. An optoelectronic device, comprising:
   a silicon substrate;
   a Zn—Si—O composite film formed on the silicon substrate; and
   a ZnO nanocrystal formed in the composite thin film,
   wherein a Zn/Si ratio in the Zn—Si—O composite thin film ranges from 1.0 to 2.0.

2. The optoelectronic device of claim 1, wherein the Zn—Si—O composite thin film is formed by sputtering silicon targets and ZnO targets.

3. The optoelectronic device of claim 2, wherein a Zn/Si ratio in the Zn—Si—O composite thin film is determined by adjusting an area ratio of the silicon targets to the ZnO targets.

4. The optoelectronic device of claim 1, wherein the ZnO nanocrystal is formed by thermal treating of the Zn—Si—O composite thin film at a temperature range of 650-750° C.

5. The optoelectronic device of claim 4, wherein the thermal treating is carried out by rapid thermal treating at a heating rate of 70° C./sec or higher.

6. The optoelectronic device of claim 4, wherein the thermal treating is carried out under inert atmosphere using nitrogen or argon.

* * * * *